(12) United States Patent
Wu

(10) Patent No.: US 10,340,918 B2
(45) Date of Patent: Jul. 2, 2019

(54) LEVEL SHIFTER

(71) Applicant: MStar Semiconductor, Inc., Hsinchu Hsien (TW)

(72) Inventor: Jun Wu, Shanghai (CN)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/968,829

(22) Filed: May 2, 2018

(65) Prior Publication Data

US 2018/0351556 A1 Dec. 6, 2018

(30) Foreign Application Priority Data

Jun. 1, 2017 (CN) .......................... 2017 1 0404315

(51) Int. Cl.
*H03L 5/00* (2006.01)
*H03K 19/0185* (2006.01)
*H03K 19/20* (2006.01)

(52) U.S. Cl.
CPC ..... *H03K 19/018521* (2013.01); *H03K 19/20* (2013.01)

(58) Field of Classification Search
CPC ..... H03K 19/018521; H03K 3/356113; H03K 19/00315; H03K 17/102; H03K 3/012
USPC .......................................... 327/333, 108, 112
See application file for complete search history.

(56) References Cited

U.S. PATENT DOCUMENTS

| 7,868,657 B1* | 1/2011 | Cassia ................ H03K 19/0013 326/27 |
| 2015/0061746 A1* | 3/2015 | Liu ................ H03K 19/018521 327/333 |

FOREIGN PATENT DOCUMENTS

| TW | 201006130 | 2/2010 |
| TW | 201711392 | 3/2017 |

* cited by examiner

*Primary Examiner* — Anh Q Tra
(74) *Attorney, Agent, or Firm* — McClure, Qualey & Rodack, LLP

(57) ABSTRACT

A level shift includes a bias voltage providing circuit, a level shifting circuit and an output switching circuit. The level shifting circuit includes a high level shifting unit and a low level shifting unit. When the high level shifting unit is in a cut-off state, the high level shifting unit further receives a first bias voltage such that the high level shifting unit is in a partially cut-off state, accordingly increasing a response speed of the high level shifting unit. When the low level shifting unit is in a cut-off state, the low level shifting unit further receives a second bias voltage such that the low level shifting unit is in a partially cut-off state, accordingly increasing a response speed of the low level shifting unit. The level shifter of the present application provides a higher response speed.

17 Claims, 3 Drawing Sheets

LEVEL SHIFTER

This application claims the benefit of China application Serial No. 201710404315.6, filed Jun. 1, 2017, the subject matter of which is incorporated herein by reference.

BACKGROUND OF THE INVENTION

Field of the Invention

The invention relates in general to a level shifter, and more particularly to a level shifter with a high response speed.

Description of the Related Art

A level shifter is used to convert an input signal having a certain voltage amplitude to an output signal having a different voltage amplitude, and is extensively applied in different types of integrated circuits having different operating voltages.

A current level shifter, and specifically a charge pump level shifter, has a low operating speed and is not suitable for operating in a high frequency. More particularly, a conventional level shifter usually adopts an input/output (IO) device, of which a high threshold voltage and a low input voltage amplitude severely affect the response speed of the IO device, resulting in an overall slow operating speed of the level shifter.

Therefore, there is a need for a level shifter to resolve the above issue.

SUMMARY OF THE INVENTION

It is a primary object of the present invention to provide a level shifter having a higher response speed.

To resolve the above technical issue, the present invention provides a level shifter including a bias voltage providing circuit, a level shifting circuit and an output switching circuit. The bias voltage providing circuit includes: a bias voltage providing unit, disposed between a first operating voltage and a ground voltage, providing a first bias voltage; and a second bias voltage providing unit, disposed between the first operating voltage and the ground voltage, providing a second bias voltage. The level shifting circuit includes: a high level shifting unit, receiving a first control signal and connected to the first operating voltage, determining whether to conduct the high level shifting circuit according to the first control signal to accordingly determine whether to output the first operating voltage; and a low level shifting unit, receiving the first control signal and connected to the second operating voltage, determining whether to conduct the low level shifting unit according to the first control signal to accordingly determine whether to output the second operating voltage. The output switching circuit includes a first switch element and a second switch element. The first switch element includes a control terminal, a first path terminal and a second path terminal, wherein the control terminal receives a first control voltage, and the first path terminal receives an output of the level shifting circuit; wherein, when the level shifting circuit outputs the first operating voltage, the first switch element is conducted to enable the output switching circuit to output the first operating voltage, and when the level shifting circuit outputs the second operating voltage, the first switch element is cut off. The second switch element includes a control terminal, a first path terminal and a second path terminal, wherein the first control terminal receives a second control voltage, and the first path terminal receives the second control signal; wherein, the second control signal is configured to match the operation of the first switch element, such that the second switch element is cut off when the first switch element is conducted, and the first switch element is cut off when the second switch element is conduct to cause the output switching circuit to output the ground voltage; the first switch element is a first-type switch element, the second switch element is a second-type switch element, and the type of the first-type switch element is different from the type of the second-type switch element. When the high level shifting unit is in a cut-off state, the high level shifting circuit further receives the first bias voltage such that the high level shifting circuit is in a partially cut-off state. When the low level shifting unit is in a cut-off state, the low level shifting circuit further receives the second bias voltage such that the low level shifting circuit is in a partially cut-off state.

Different from the prior art, the level shifter of the present invention allows the high level shifting unit and the low level shifting unit to be in a partially cut-off state to accordingly increase a response speed thereof. Further, the core devices and the first-type IO devices also significantly increase the response speed, thus enhancing the overall operation speed of the device and allowing the device to operate in high frequencies.

The above and other aspects of the invention will become better understood with regard to the following detailed description of the preferred but non-limiting embodiments. The following description is made with reference to the accompanying drawings.

DETAILED DESCRIPTION OF THE INVENTION

Specific details are given in the description below to fully understand the present invention, which can however by implemented by various other methods apart from those given in the following description. A person skilled in the art could make similar arrangements and modifications without departing from the spirit of the present invention, and therefore the present invention is not limited to the embodiments disclosed below.

In view of the issues of the prior art, the present invention provides a level shifter. Details of the present invention are given in the embodiments with the accompanying drawings below.

Figure 1:
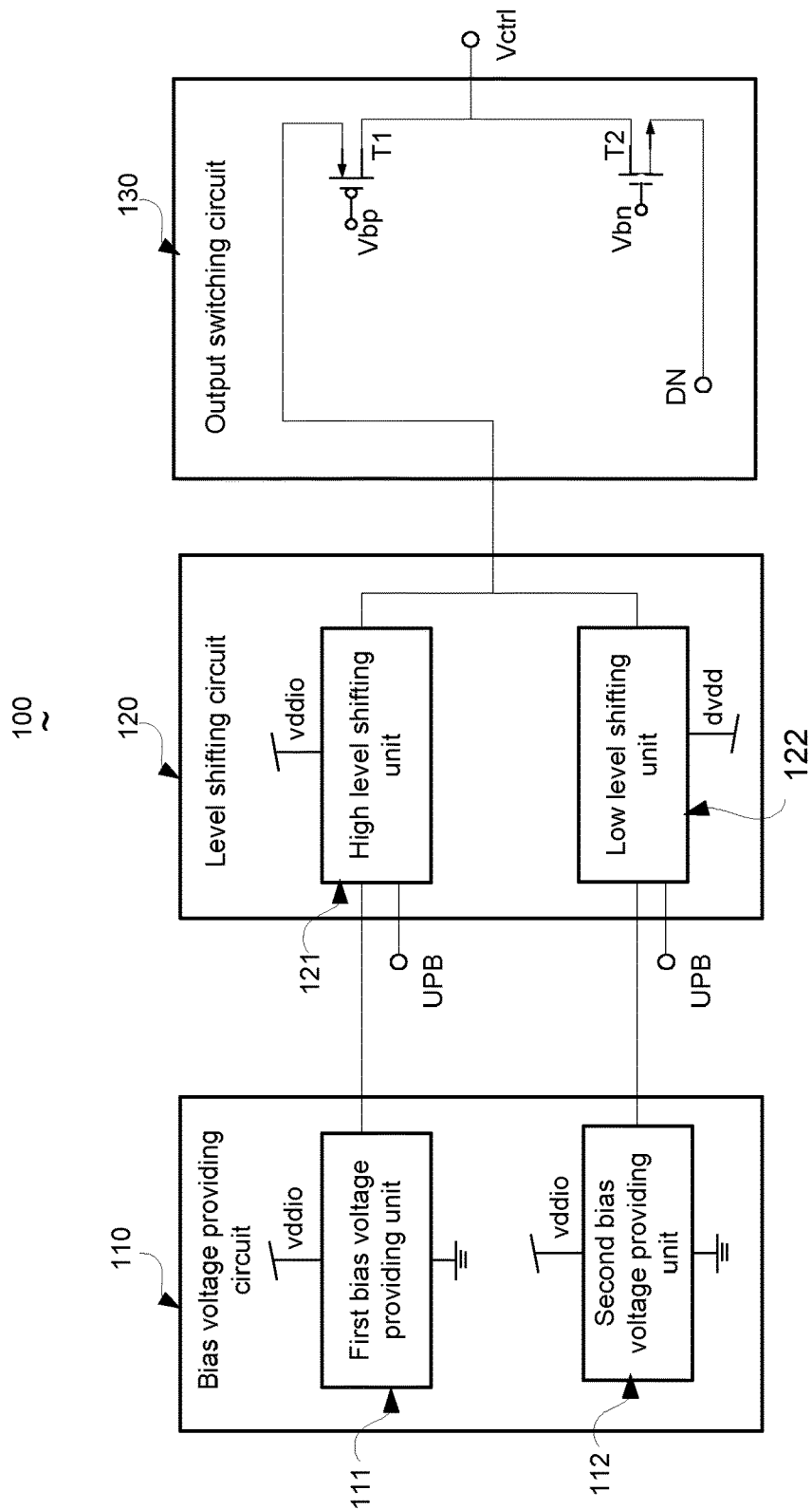
FIG. 1 is a block diagram of a level shifter according to an embodiment of the present invention.

FIG. 1 shows a block diagram of a level shifter according to an embodiment of the present invention. The level shifter 100 includes a bias voltage providing circuit 110, a level shifting circuit 120 and an output switching circuit 130.

The bias voltage providing circuit 110 includes a first bias voltage providing unit 111 and a second bias voltage providing unit 112. The first bias voltage providing unit 111 is disposed between a first operating voltage vddio and a ground voltage, and provides a first bias voltage. The second bias voltage providing unit 112 is also disposed between the first operating voltage vddio and the ground voltage, and provides a second bias voltage. In the embodiment of the present invention, the first operating voltage vddio may be set to 3.3V.

The level shifting circuit 120 includes a high level shifting unit 121 and a low level shifting unit 122. The high level shifting unit 121 is connected to the first operating voltage vddio, receives a first control signal UPB, and determines whether to conduct the high level shifting unit 122 according to the first control signal UPB to further determine whether to output the first operating voltage vddio. The low level shifting unit 122 is connected to a second operating voltage dvdd, receives the first control signal UPB, and determines whether to conduct the low level shifting unit 122 according to the first control signal UPB to further determine whether to output the second operating voltage dvdd. The first control signal UPB is a pulse width modulation (PWM) signal formed by the ground voltage and the second operating voltage dvdd. In this embodiment, the second operating voltage dvdd may be set to 1.1V The output switching circuit 130 includes switch elements T1 and T2. A person skilled in the art could understand that, each of the switch elements described below includes a control terminal, a first path terminal and a second path terminal, and may be implemented by a transistor. The control terminal of the switch element refers to the gate of a transistor, the first path terminal of the switch element refers to the source of a transistor, and the second path terminal of the switch element refers to the drain of a transistor.

The control terminal of the switch element T1 receives a first control voltage Vbp, and the first path terminal receives an output of the level shifting circuit 120. When the level shifting circuit 120 outputs the first operating voltage vddio, the switch element T1 is conducted so as cause the output switching circuit 130 to output the first operating voltage vddio. When the level shifting circuit 120 outputs the second operating voltage dvdd, the switch element T1 is cut-off.

The control terminal of the switch element T2 receives a second control voltage Vbn, and the first path terminal receives a second control signal DN. The second control signal DN is similarly a PWM signal formed by the ground voltage and the second operating voltage dvdd, and is designed to match the operation of the switch element T1, such that the switch element T2 is cut off when the switch element T1 is conducted, and the switch element T1 is cut off when the switch element T2 is conducted so as to enable the output switching circuit 300 to output the ground voltage. In an embodiment of the present invention, the second control signal DN may be designed as, the switch element T2 is cut off when the second control signal DN is the ground voltage, and the switch element T2 is conducted when the second control signal DN is the second operating voltage dvdd, so as to enable the output switching circuit 130 to output the ground voltage.

The switch element T1 is a first-type switch element, the switch element T2 is a second-type switch element, and the type of the first-type switch element is different from the type of the second-type switch element. In an embodiment of the present invention, the switch element T1 is a PMOS transistor, and the switch element T2 is an NMOS transistor.

In the present invention, when the high level shifting unit 121 is in a cut-off state, it further receives a first bias voltage provided by the first bias voltage providing unit 111, such that the high level shifting unit 121 is in a partially cut-off state, thus increasing the response speed of the high level shifting unit 121. When the low level shifting unit 122 is in a cut-off state, it further receives a second bias voltage provided by the first bias voltage providing unit 112, such that the low level shifting unit 122 is in a partially cut-off state, thus increasing the response speed of the low level shifting unit 122.

Figure 2:
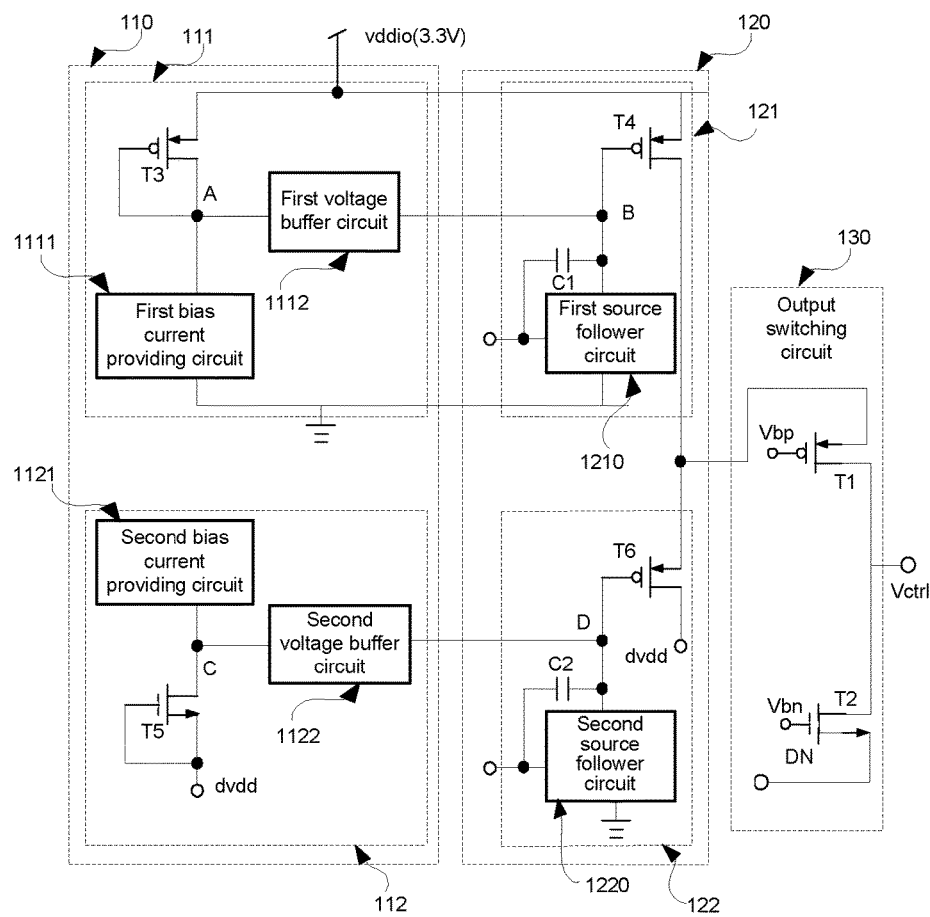
FIG. 2 is a brief schematic diagram of the level shifter according to an embodiment of the present invention.

That is to say, in the level shifter 100 of the present invention, the bias voltage providing circuit 110 before the level shifting circuit 120 is further designed to provide a bias voltage to the level shifting circuit 120, such that some components originally in a cut-off state may become in a partially cut-off state when the level shifting circuit 120 switches between the first operating voltage vddio and the second operating voltage dvdd. Thus, when switching is performed, a response can be given quickly to accordingly enhance the overall operating speed of the device. FIG. 2 shows a brief schematic diagram of the level shifter in FIG. 1 according to an embodiment of the present invention. As shown in FIGS. 1 and 2, the first bias voltage providing unit 111 in this embodiment includes a switch element T3, a first bias current providing circuit 1111 and a first voltage buffer circuit 1112.

The first path terminal of the switch element T3 is connected to the first operating voltage vddio, and the control terminal and the second path terminal thereof are connected together at a connecting position defined as a first node A. The first bias current providing circuit 1111 is connected to the first node A, and is connected to the switch element T3 via the first node A to further provide the switch element T3 with a bias current, so as to enable the switch element T3 to generate the first bias voltage at the first node A. The first voltage buffer circuit 1112 is also connected to the node A to buffer the first bias voltage outputted.

The high level shifting unit 121 includes a switch element T4 and a first source follower circuit 1210. The first path terminal of the switch element T4 is also connected to the first operating voltage vddio, and the second path terminal serves as an output end of the high level shifting unit 121 and is connected to the low level shifting unit 122. The first source follower circuit 1210 is connected to the control terminal of the switch element T4 at a connecting position defined as a second node B. The first source follower circuit 1210 is connected to the first bias voltage providing unit 111 via the second node B in a way that the voltage at the second node B changes with a change in the first bias voltage, such that the switch element T4 is in a partially cut-off state when the high level shifting unit 121 is in a cut-off state.

That is to say, in this embodiment, the first bias current providing circuit 1111 in the first bias voltage providing unit 111 provides a bias current to the switch element T3 to enable the switch element T3 to generate the first bias voltage at the first node A; with the first voltage buffer circuit 1112 and the first source follower circuit 1210 in the high level shifting unit 121, the voltage at the second node B changes with the change in the first bias voltage at the first node A. Thus, when the high level shifting unit 121 is in a cut-off state, the switch element T4 can be in a partially cut-off state.

Similarly, the second bias voltage providing unit 112 includes switch element T5, a second bias current providing circuit 1121 and a second voltage buffer circuit 1122. The first path terminal of the switch element T5 is connected to the second operating voltage dvdd, and the control terminal and the second path terminal thereof are connected together at a connecting position defined as a third node C. The second bias current providing circuit 1121 is connected to the third node C, and is connected to the switch element T5 via the node C to provide the switch element T5 with a bias current, so as to enable the switch element T5 to generate a second bias voltage at the third node C. The second voltage buffer circuit 1122 is connected to the third node C to buffer the second bias voltage outputted.

The low shifting unit 1220 includes a switch element T6 and a second source follower circuit 1220. The first path terminal of the switch element T6 is connected to the second operating voltage dvdd, and the second path terminal thereof serves as an output end of the low level shifting unit 122 and is connected to the high level shifting unit 121. The second source follower circuit 1220 is connected to the control terminal of the switch element T6 at a connecting position defined as a fourth node D, and is connected to the second bias voltage providing unit 112 via the fourth node D in a way that the voltage at the fourth node D changes with a change in the second bias voltage, such that the switch element T6 is in a partially cut-off state when the low level shifting unit 122 is in a cut-off state.

Figure 3:
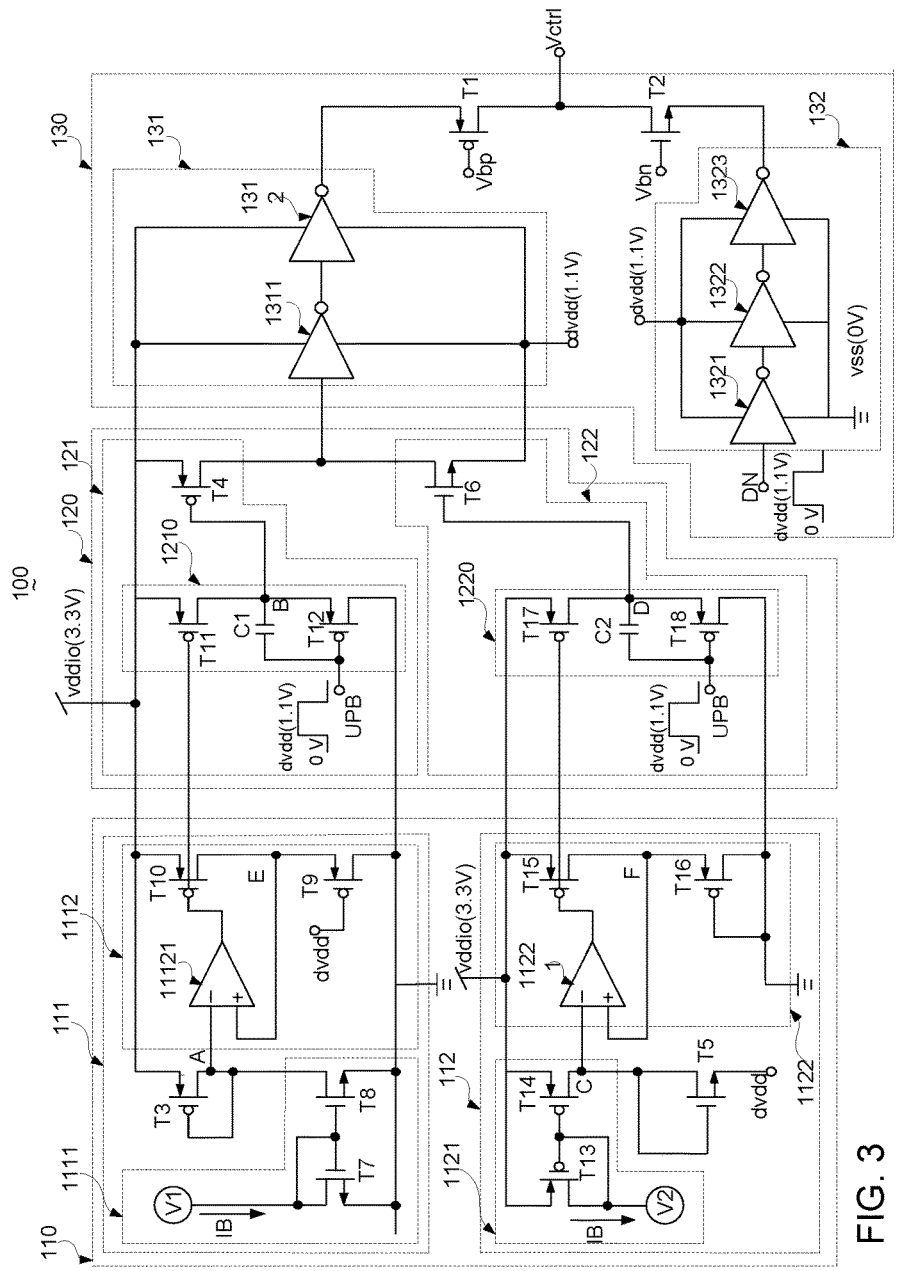
FIG. 3 is a circuit schematic diagram of the level shifter in FIG. 1 and FIG. 2 according to an embodiment of the present invention.

FIG. 3 shows a circuit schematic diagram of the level shifter in FIGS. 1 and 2 according to an embodiment of the present invention. The present invention is further described with reference to FIGS. 1 to 3.

The first bias voltage current providing circuit 1111 in the first bias voltage providing unit 111 includes switch elements T7 and T8. The first voltage buffer circuit 1112 includes a first operational amplifier 11121 and switch elements T9 and T10.

The first path terminal of the switch element T7 is connected to the ground voltage, and the control terminal and the second path terminal are connected to a first voltage source V1, i.e., a voltage source provided from an external terminal. The control terminal of the switch element T8 is connected to the first voltage source V1, and the first path terminal is connected to the ground voltage.

The first operational amplifier 11211 includes a positive input end, a negative input end and an output end, wherein the negative input end is connected to the first node A. The control end of the switch element T9 is connected to the second operating voltage dvdd, and the second path terminal is connected to the ground voltage. The control terminal of the switch element T10 is connected to the output end of the first operational amplifier 11211, the first path terminal is connected to the first operating voltage vddio, and the second path terminal is connected to the first path terminal of the switch element T9 at a connecting position defined as a fifth node E. The positive input end of the first operational amplifier 11211 is further connected to the fifth node E.

The first source follower circuit 1210 in the high level shifting unit 121 includes switch elements T11 and T12. The control terminal of the switch element T11 is connected to the output end of the operational amplifier 11211, and the first path terminal is connected to the first operating voltage vddio. The control terminal of the switch element T12 receives the first control signal UPB, the second path terminal thereof is connected to the ground voltage, and the first path terminal thereof is connected to the second path terminal of the switch element T11. A connecting position between the second path terminal of the switch element T11 and the first terminal path of the switch element T12 is the second node B, which is further connected to the control terminal of the switch element T4.

Similarly, the second bias voltage current providing circuit 1121 in the second bias voltage providing unit 112 includes switch elements T13 and T14, and the second voltage buffer circuit 1122 includes a second operational amplifier 11221 and switch elements T15 and T16.

The first path terminal of the switch element T13 is connected to the first operating voltage vddio, and both of the control terminal and the second path terminal thereof are connected to a second voltage source V2, i.e., a voltage source provided from an external terminal. The control terminal of the switch element T14 is connected to the second voltage source V2, and the first path terminal is connected to the first operating voltage vddio. The second operational amplifier 11221 includes a positive end, a negative end and an output end, wherein the negative input end is connected to the third node C. The control terminal of the switch element T15 is connected to the output end of the second operational amplifier 11221, and the first path terminal is connected to the first operating voltage vddio. The control terminal and the second path terminal of the switch element T16 are connected to the ground voltage, and the first path terminal is connected to the second path terminal of the switch element T15 at a connecting position defined as a sixth node F. Further, the positive input end of the second operational amplifier 11221 is connected to the sixth node F.

The second source follower circuit 1220 in the low level shifting unit 122 includes switch elements T17 and T18. The control terminal of the switch element T17 is connected to the output end of the second operational amplifier 11221, and the first path terminal thereof is connected to the first operating voltage vddio. The control terminal of the switch element T18 receives the first control signal UPB, the second path terminal is connected to the ground voltage, and the first path terminal is connected to the second path terminal of the switch element T17. A connecting position between the second path terminal of the switch element T17 and the first path terminal of the switch element T18 is the fourth node D, which is further connected to the control terminal of the switch element T6.

In this embodiment, the switch elements T3, T3, T9, T10, T11, T12, T13, T14, T15, T16, T17 and T18 are first-type switch elements, i.e., PMOS transistors, and the switch elements T5, T6, T7 and T8 are second-type switch elements, i.e., NMOS transistors.

In the embodiment of the present invention, the high level shifting unit 121 may further include a capacitor C1, which is disposed between the control terminal of the switch T12 and the second node B. Similarly, the low level shifting unit 122 may further include a capacitor C2, which is disposed between the control terminal of the switch element T18 and the fourth node D.

The output switching circuit 130 may further include a first buffer unit 131 and a second buffer unit 132. The first buffer unit 131 is disposed between the output end of the level shifting circuit 120 and the first path terminal of the switch element T1. The second buffer unit 132 is disposed between the second control signal DN and the first path terminal of the switch element T2.

Each of the first buffer unit 131 and the second buffer unit 132 may be formed by multiple inverters. In an embodiment of the present invention, the first buffer unit 131 includes a first inverter 1311 and a second inverter 1312. The first inverter 1311 and the second inverter 1312 are both disposed between the first operating voltage vddio and the second operating voltage dvdd, and each includes an input end and an output end. Further, the first inverter 1311 and the second inverter 1312 are connected in series, the input end of the first inverter 1311 is connected to the output end of the level shifting circuit 120, and the output end of the second inverter 1312 is connected to the first path terminal of the switch element T1, so as to transmit the output of the level shifting circuit 120 to the first path terminal of the first switch element T1.

The second buffer unit 132 includes a third inverter 1321, a fourth inverter 1322 and a fifth inverter 1323. The third inverter 1321, the fourth inverter 1322 and the fifth inverter 1323 are connected in series and are disposed between the second operating voltage dvdd and the ground voltage, and each includes an input end and an output end. The input end of the third inverter 1321 receives the second control signal DN, the input end of the fourth inverter 1322 is connected to the output end of the third inverter 1321, the input end of the fifth inverter 1323 is connected to the output end of the fourth inverter 1322, and the output end of the fifth inverter 1323 is connected to the first path terminal of the switch element T2, so as to transmit an inverted signal of the second control signal DN to the first path terminal of the switch element T2.

In an embodiment of the present invention, the third inverter 1321, the fourth inverter 1322 and the fifth inverter 1323 in the second buffer unit 132 are implemented by core devices; the switch elements T3, T4, T5 and T6 and the first inverters 1311 and the second inverters 1312 in the first buffer unit 131 are implemented by first-type IO devices; and the remaining devices, such as the switch elements T1, T2 and T7 to T18, the first operational amplifier 11121 and the second operational amplifier 11221 are all implemented by second-type IO devices. The driving voltage of the first-type IO devices is lower than the driving voltage of the second-type IO devices.

That is to say, in an embodiment of the present invention, in the first bias voltage providing unit 111 in the bias voltage providing circuit 110, the switch element T3 is a first-type IO device, and the other components are second-type IO devices. Correspondingly, in the second bias voltage providing unit 112, the switch element T5 is a first-type IO device, and the other components are all second-type IO devices. In the high level shifting unit 121 of the level shifting circuit 120, the switch element T4 is a first-type IO device, and the switch elements T11 and T12 are second-type IO devices. Correspondingly, in the low level shifting unit 122, the switch element T6 is a first-type IO device, and the switch elements T17 and T18 are second-type IO devices. The switch elements T1 and T2 in the output switching circuit 130 are implemented by second-type IOD devices. The first inverter 1311 and the second inverter 1312 in the first buffer unit 131 are first-type IO devices, and the third inverter 1321, the fourth inverter 1322 and the fifth inverter 1323 in the second buffer unit 132 are core devices.

A person skilled in the art can understand that, a core device usually has a higher speed and a more robust driving capability, but can withstand a lower voltage difference. An IO device has a lower speed and a weaker driving capability, but can withstand a higher voltage difference. Therefore, in the present invention, the core devices require a lower driving voltage but can only operate in an environment having a lower voltage difference; the IO devices require a higher driving voltage but can operate in an environment having a larger voltage difference.

In an embodiment of the present invention, the first-type IO devices may be 2.5V IO devices, and the second-type IO devices may be 3.3V IO devices. That is to say, the first-type IO devices can only withstand a voltage difference of 2.5V but require a lower driving voltage, whereas the second-type IO devices can withstand a voltage difference of 3.3V but require a higher driving voltage. Operation principles of the above level shifter are further given below. Referring to FIGS. 1 to 3, in an embodiment of the present invention, the first voltage source V1 is a high voltage source, and the second voltage source V2 is a low voltage source, e.g., a ground voltage. Thus, under the effect of the first voltage source V1, the switch elements T7 and T8 in the first bias current providing circuit 1111 are both conducted, and a current IB flows through the switch element T7.

Because the switch element T8 is conducted, the ground voltage discharges the first node A via the conducted switch element T8, i.e., the conducted switch element T8 transmits the ground voltage to the first node A. At this point, the voltage at the first node A is a low voltage, i.e., logic "0". The switch element T3 is a PMOS transistor, and has the first path terminal thereof connected to the first operating voltage vddio (i.e., a high voltage). Thus, the switch element T3 is conducted, and the first operating voltage vddio charges the switch element T3 to pull up the voltage at the first node A.

The switch element T8 is maintained in a conducted state, and so the ground voltage discharges the first node A via the conducted switch element T8, and the first operating voltage vddio charges the first node A via the conducted switch element T3, both achieving a balanced state. That is to say, during operation, the first node A has a certain level of voltage, which is higher than the ground voltage and lower than the first operating voltage vddio.

Similarly, under the effect of the second voltage source V2, the switch elements T13 and T14 in the second bias current providing circuit 1121 are both conducted, and the current IB flows out via the conducted switch element T13.

Because the switch element T14 is conducted, the first operating voltage vddio charges the third node C to pull up the voltage at the third node C. When the voltage at the third node C is pulled up to a certain level, the switch element T5 is conducted, and the second operating voltage dvdd discharges the third node C via the conducted switch element T5, both reaching a balanced state. Thus, during operation, the third node C also has a certain level of voltage, which is higher than the second operating voltage dvdd (1.1V) and lower than the first operating voltage vddio (3.3V).

With respect to the first bias voltage providing unit 111 and the high level shifting unit 121, the control terminal of the switch element T9 is connected to the second operating voltage dvdd (1.1V). Thus, the switch element T9 is in a cut-off state, and cannot be conducted easily.

The fifth node E in an initial stage is in a virtual state, i.e., level "0". Because the positive input end of the first operational amplifier 11121 is connected to the fifth node E, the voltage at the positive input end of the first operational amplifier 11121 in the initial stage is smaller than the voltage at the negative input end of the operational amplifier 11121, i.e., logic "0". In the above condition, the switch element T10 is conducted, and the first operating voltage vddio charges the fifth node E via the conducted switch element T10 to pull up the voltage at the fifth node E.

With the pulled up voltage at the fifth node E, the voltage at the positive input end of the first operational amplifier 11121 is also pulled up, i.e., a voltage difference between the positive input end and the negative input end is reduced, and thus the voltage outputted from the output end of the first operational amplifier 11121 increases. As a result, the voltage difference between the control terminal and the first path terminal of the switch element T10 is reduced, and the switch element T10 is gradually cut off. Theoretically, the voltages at the fifth node E, the positive end and the negative end of the first operational amplifier 111211 should become consistent.

When the first control signal UPB is in the second operating voltage dvdd (1.1V), as shown in FIG. 3, a circuit formed by the switch elements T1 to T12 in the first source follower circuit 1210 is the same as the circuit formed by the switch elements T9 and T10. Thus, the second node B is similar to the fifth node E, and also has a certain level of voltage, that is, the voltage at the second node B is expected to be equal to the voltage at the negative input end of the first operational amplifier 11121.

At this point, due to the certain level of voltage at the second node B, the switch element T4 in the high level shifting unit 121 is in a cut-off state.

In contrast, for the second bias voltage providing unit 111 and the low level shifting unit 121, the sixth node F in the initial stage is in a virtual state, i.e., level "0". Because the positive input end of the second operational amplifier 11221 is connected to the sixth node F, the voltage at the positive input end of the second operational amplifier 11221 in the initial stage is lower than the voltage at the negative input end of the second operational amplifier 11221. Thus, the second operational amplifier 11221 outputs a low voltage. At this point, the switch element T15 is conducted, and the first operating voltage vddio charges the sixth node F via the conducted switch element T15 to pull up the voltage at the sixth node F.

With the pulled up voltage at the sixth node F, the voltage at the positive input end of the second operational amplifier 11221 is also pulled up, that is, a voltage difference between the positive input end and the negative input end of the second operational amplifier 11221 is reduced.

It should be noted that, the control terminal of the switch element T16 is connected to the ground voltage. Thus, when the voltage at the sixth node F is pulled up to a certain level, the switch element T16 is conducted, and the ground voltage discharges the sixth node F via the conducted switch element T16, i.e., pulling down the voltage at the sixth node F.

That is to say, the first operating voltage vddio (3.3V) charges the sixth node F via the switch element T15, the ground voltage discharges the sixth node F via the switch element T16, and the second operational amplifier 11221 adjusts a conduction level or cut-off level of the switch element T15 according to the voltage values at the negative input end and the positive input end of the second operational amplifier 11221 to reach a certain level of balance.

During this process, because the first control signal UPB is at the second operating voltage dvdd (1.1V) and the control terminal of the switch element T18 is connected to the first control signal UPB, it is difficult to conduct the switch element T18. The switch element T17 is similar to the switch element T15 and is controlled by the voltage outputted from the output end of the second operational amplifier 11221. That is to say, when the switch element T15 is conducted and the first operating voltage vddio charges the sixth node F, the switch element T17 is also conducted and the first operating voltage vddio similarly charges the fourth node D. However, it should be noted that, a circuit formed by the switch elements T17 and T18 does not include a discharging path (because the switch element T18 is connected to the first control signal UPB at the second operating voltage dvdd, and is in a cut-off state), that is, the fourth node D is charged by only the first operating voltage vddio via the switch element T17.

That is to say, it is known by comparing the circuit formed by the switch elements T17 and T18 in the second source follower 1220 with the circuit formed by the switch elements T15 and T16 that, the circuit formed by the switch elements T17 and T18 performs only charging but not discharging, whereas the circuit formed by the switch elements T15 and T16 performs both charging and discharging. Thus, the voltage at the fourth node D is inevitably higher than the voltage at the sixth node F. As previously stated, the voltage at the third node C is higher than the second operating voltage dvdd (1.1V) and is lower than the first operating voltage vddio (3.3V), and the voltage at the sixth voltage F is approximately consistent with the voltage at the third node C, and is definitely higher than the second operating voltage dvdd (1.1V). Hence, the voltage at the fourth node D is definitely higher than the voltage at the sixth node F.

Thus, for the switch element T6 in the low level shifting unit 122, despite that the first path terminal thereof is connected to the second operating voltage dvdd, the control terminal thereof is however connected to the fourth node D. During this process, a large voltage value is gathered on the fourth node D, and so the switch element T6 is conducted. It should be noted that, the switch element T6 is a first-type IO device (2.5V IO device), and can be conducted without a particularly high voltage.

That is, when the first control signal UPB is at the second operating voltage dvdd (1.1V), the switch element T4 is cut off, i.e., that high level shifting circuit 121 in the left shifter 120 is cut off, and the switch element T6 is conducted, i.e., the low level shifting circuit 122 in the level shifter 120 is conducted. Accordingly, the level shifter 120 outputs the second operating voltage dvdd via the conducted switch element T6.

Further, a person skilled in the art can understand that, at this point, the circuit formed by the switch elements T4 and T6 is similar to the circuit formed by the switch elements T3 and T8.

More specifically, because the switch element T8 is in a conducted state under the effect of the first voltage source V1, the ground voltage discharges the first node A via the conducted switch element T8, and the voltage at the first node A is pulled down. If the voltage at the first node A is pulled down to a certain level, the switch element T3 is conducted, and the first operating voltage vddio charges the first node A via the conducted switch element T3 to pull up the voltage at the first node A. Thus, the voltage at the first node A rises, and the switch element T3 is cut off.

That is to say, during the above process, the first bias current providing circuit 1111 provides the switch element T3 with a bias current in a way that a specific first bias voltage is generated at the first node A. Further, because the first node A is also connected to the control terminal of the switch element T3, the first bias voltage at the first node A causes the switch element T3 to be in a partially cut off state, and once the first bias voltage at the first node A is reduced to a certain level, the first operating voltage vddio quickly replenishes the voltage at the first node A. In other words, during this process, leakage current flows through the switch element T3 to replenish the voltage at the first node A, and the switch element T3 is extremely sensitive.

Similarly, as previously described, the voltage at the second node B charges with a change in the first bias voltage at the first node A (i.e., the voltage at the negative input end of the first operational amplifier 11121). Thus, similar to the switch element T3, due to the effect of the voltage at the second node B, the switch element T4 is also in a partially cut off state, and leakage current flows through the switch element T4. More particularly, the switch element T4 and the switch element T3 are both first-type IO devices (2.5V IO devices), and therefore do not require a high driving voltage.

When the first control signal UPB is switched from the second operating voltage dvdd (1.1V) to the ground voltage (0V), the switch element T12 in the first source follower circuit 1210 is conducted. Thus, the ground voltage discharges the second node B via the conducted switch element T12 to pull down the voltage at the second node B.

At this point, as the voltage at the second node B is pulled down, the switch element T4 is conducted. More particularly, because the switch element T4 is previously in a partially cut-off state, it can switch to a conducted state extremely fast. That is to say, the response speed of the high level shifting unit 121 is higher.

Further, the capacitor C1 is further provided between the control terminal of the switch element T2 and the second node B. Thus, when the first control signal UPB received by the control terminal of the switch element T12 is switched from the second operating voltage dvdd to the ground voltage, i.e., the voltage at the control terminal of the switch element T12 jumps from the second operating voltage dvdd to the ground voltage, due to a coupling effect (bootstrap effect) of the capacitor C1, a voltage jump will also occur in the voltage at the second node B, which then changes towards the ground voltage. That is to say, the capacitor C1 provided further promotes the discharging on the voltage at the second node B to pull down the voltage at the second node B. Hence, the capacitor C1 provided can further enhance the response speed of the high level shifting unit 121, enabling the high level shifting unit 121 to be free from limitations of the switching speed of the switch element T12.

Correspondingly, when the first control signal UPB switches from the second operating voltage (1.1V) to the ground voltage (0V), the switch element T18 in the low level shifting unit 122 is conducted. Thus, the ground voltage discharges via the switch element T18 to pull down the voltage at the fourth node D.

At this point, as the voltage at the fourth node D is pulled down, the switch element T6 is cut off. The capacitor C2 between the control terminal of the switch element T18 and the fourth node D further enhances the response speed of the low level shifting unit 122, enabling the low level shifting unit 122 to be free from limitations of the switching speed of the switch element T18.

That is to say, when the first control signal UPB is at the ground voltage, the switch element T4 is conducted, which is equivalently conducting the high level shifting unit 121; and the switch element T6 is cut off, further cutting off the low level shifting unit 122. Thus, the output end of the level shifting circuit 120 outputs the first operating voltage vddio (3.3V) via the conducted switch element T4.

When the first control signal UPB is in the ground voltage, the circuit formed by the switch elements T17 and T18 in the low level shifting unit 122 is similar to the circuit formed by the switch elements T15 and T16 in the second bias voltage providing unit 112. That is, the ground voltage discharges the fourth node D and the sixth node F via the switch elements T18 and T16, respectively, and the first operating voltage vddio charges the fourth node D and the sixth node F via the switch elements T17 and T15, respectively. The voltage at the sixth node F is equal to the voltage at the negative input end of the second operational amplifier 11221, and is approximately consistent with the voltage at the positive input end (i.e., the third node C) of the second operational amplifier 11221, that is, the voltage at the fourth node D changes with a change in the second bias voltage at the third node C.

Thus, in the above situation, in the circuit formed by the switch element T4 (in a conducted state) and the switch element T6 (in a cut-off state) in the level shifting circuit 120 is similar to the circuit formed by the switch elements T14 and T5 in the second bias voltage providing unit 112.

The switch element T14 is conducted under the effect of the second voltage source V2, and the first operating voltage vddio continues to charge the third node C to pull up the voltage at the third node C. When the voltage at the third node C is pulled up to a certain level, the switch element T5 is conducted, and the second operating voltage dvdd discharges the third node C to pull down the voltage at the third node C. With the pulled down voltage at the node C, the switch element T5 is cut off. Because the switch element T14 is continually conducted, the charging process is continually performed and the voltage at the third node C is continually pulled up, the above process is sequentially iterated.

In other words, when the switch element T5 is in a partially cut-off state and the voltage at the third node C is pulled up to a certain level, and the second operating voltage dvdd quickly discharges the third C, i.e., leakage current flows through the switch element T5.

Similarly, because the voltage at the fourth node D follows that of the third node C, the switch element T6 is similarly in a partially cut-off state. The switch elements T5 and T6 are first-type IO devices (2.5V IO devices).

Therefore, in this embodiment, when the high level shifting unit 121 or the low level shifting unit 122 in the level shifting circuit 120 is in a cut-off state, it is actually in a partially cut-off state according to the bias voltage provided by the bias voltage providing circuit 110. Thus, the response speed is extremely high during switching, enabling the level shifting circuit 120 to quickly switch between the first operating voltage vddio (3.3V) and the second operating voltage dvdd (1.1V).

Operation principles of the output switching circuit 130 are given below.

In an embodiment of the present invention, the second control signal DN is also a PWM signal formed by the ground voltage and the second operating voltage dvdd, and is identical to the first control signal UPB.

Further, the first control voltage Vbp should be larger than a difference between the second operating voltage dvdd and the threshold voltage of the switch element T1, and the second control voltage Vbn should be smaller than a sum of the second operating voltage dvdd and the threshold voltage of the second switch element T2.

As previously described, when the first control signal UPB is at the first operating voltage (1.1V), the level shifting circuit 200 outputs the second operating voltage dvdd; when the first control signal UPB is at the ground voltage, the level shifting circuit 200 outputs the first operating voltage vddio (3.3V).

Thus, when the first control signal UPB is at the second operating voltage dvdd, the level shifting circuit 200 outputs the second operating voltage dvdd. The second operating voltage dvdd outputted from the level shifting circuit 200 then undergoes two inversion processes performed by the first inverter 1311 and the second inverter 1312 in the first buffer unit 131, and is transmitted to the first path terminal (i.e., the source) of the switch element T1.

The control terminal (i.e., the gate) of the switch element T1 is connected to the first control voltage Vpb, which is a constant voltage value that should be greater than the difference between the second operating voltage dvdd and the threshold voltage vthp of the switch element T1, i.e., Vbp>dvdd−vthp.

Thus, the voltage difference between the source and the gate of the switch element T1 is:

$$dvdd-Vbp<dvdd-(dvdd-vthp)=vthp.$$

That is to say, the voltage difference between the source and the gate of the switch element T1 is smaller than the threshold voltage vthp, and so the switch element T1 is cut off.

At this point, the second control signal DN is also at the second operating voltage dvdd. The second control signal DN is processed by the third inverter 1321, the fourth inverter 1322 and the fifth inverter 1323 in the second buffer unit 132, and an inverted signal of the second control signal DN is outputted to the first path terminal (i.e., the source) of the switch element T2. Meanwhile, because the third inverter 1321, the fourth inverter 1322 and the fifth inverter 1323 are disposed between the second operating voltage dvdd and the ground voltage, the first path terminal of the switch element T2 receives the ground voltage at this point.

The control terminal (i.e., the gate) of the switch element T2 is connected to the second control voltage Vbn, which is also a constant voltage value and should be smaller than the sum of the second operating voltage and the threshold vthn of the switch element T2, i.e., Vbn<dvdd+vthn.

Therefore, the voltage difference between the gate and the source of the switch element T2 is:

$$Vbn-0<dvdd+vthn.$$

That is to say, at this point, the voltage difference between the gate and the source of the switch element T2 is definitely greater than the threshold voltage vthn, and so the switch element T2 is conducted, so as to transmit the ground voltage to the output end Vctrl of the output switching circuit 300.

Therefore, when the first control signal UPB and the second control signal DN are both at the second operating voltage dvdd, the switch element T1 in the output switching circuit 300 is cut off and the switch element T2 is conducted, and the ground voltage is outputted via the conducted switch element T2.

When the first control signal UPB is at the ground voltage, the level shifting circuit 200 outputs the first operating voltage vddio, and so the first path terminal of the switch element T1 receives the first operating voltage vddio.

At this point, the voltage difference between the source and the gate of the switch element T1 is:

$$vddio-Vbp<vddio-(dvdd-vthp)=(vddio-dvdd)+vthp.$$

Since the first operating voltage vddio (3.3V) is far higher than the second operating voltage dvdd (1.1V), the switch element T1 is conducted at this point, and the conducted switch element T1 transmits the first operating voltage vddio (3.3V) to the output end Vctrl of the output switching circuit 300.

At this point, the second control signal DN is also at the ground voltage, and the first path terminal of the switch element T2 receives the inverted signal of the second control voltage DN, i.e., the second operating voltage dvdd.

At this point, the voltage difference between the gate and the source of the switch element T2 is:

$$Vbn-dvdd<(dvdd+vthn)-dvdd=vthn.$$

That is to say, the voltage difference between the gate and the source of the switch element T2 is smaller than the threshold voltage vthn, and so the switch element T2 is cut off.

Thus, when the first control signal PUB and the second control signal D are both at the ground voltage, the switch element T1 in the output switching circuit 300 is conducted and the switch element T2 is cut off, and the first operating voltage vddio (3.3V) is outputted via the conducted switch element T1.

In an embodiment of the present invention, the first buffer unit 131 is formed by two inverters 1311 and 1312, i.e., an even number of inverters; the second buffer 132 is formed by the inverters 1321, 1322 and 1323, i.e., an odd number of inverters; the first control signal UPB is the same as the second control signal DN.

However, a person skilled in the art could conceive of making corresponding changes to the first buffer unit 131, the second buffer unit 132, the first control signal UPB and the second control signal DN. For example, the second buffer unit 132 is formed by an even number of inverters, and the second control signal DN is an inverted signal of the first control signal UPB.

Further, because the inverters 1321, 1322 and 1323 in the second buffer unit 132 are disposed between the second operating voltage dvdd (1.1V) and the ground voltage and need to withstand a lower voltage difference, the inverters 1321, 1322 and 1323 may be implemented by core devices having a higher response speed.

The inverters 1311 and 1312 in the first buffer unit 131 are disposed between the first operating voltage vddio (3.3V) and the second operating voltage dvdd (1.1V), and are not required to withstand an excessively high voltage difference. Thus, the inverters 1311 and 1312 may be implemented by first-type IO devices, i.e., 2.5V IO devices, which also have a higher response speed.

In conclusion, the level shifter 100 of the present invention is capable of causing the high level shifting unit 121 and the low level shifting unit 122 to be in a partially cut off state, accordingly providing a higher response speed. Further, using the core devices and the first-type IO devices also increases the response speed and enhances the overall operation speed of the device, making the device suitable to operate in high frequencies.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter, comprising:
 a bias voltage providing circuit, comprising:
  a first bias voltage providing unit, disposed between a first operating voltage and a ground voltage, providing a first bias voltage; and
  a second bias voltage providing circuit, disposed between the first operating and the ground voltage, providing a second bias voltage;
 a level shifting circuit, comprising:
  a high level shifting unit, receiving a first control signal and connected to the first operating voltage, determining whether to conduct the high level shifting unit according to the first control signal to accordingly determine whether to output the first operating voltage; and
  a low level shifting unit, receiving the first control signal and connected to the second operating voltage, determining whether to conduct the low level shifting unit according to the first control signal to accordingly determine whether to output the second operating voltage;

an output switching circuit;
a first switch element, comprising a control terminal, a first path terminal and a second path terminal; wherein, the first control terminal receives a first control voltage, the first path terminal receives an output of the level shifting circuit, the first switch element is conducted when the level shifting circuit outputs the first operating voltage such that the output switch circuit outputs the first operating voltage, and the first switch element is cut off when the level shifting circuit outputs the second operating voltage;

a second switch element, comprising a control terminal, a first path terminal and a second path terminal; wherein, the control terminal receives a second control voltage, the first path terminal receives a second control signal designed to match an operation of the second switch element, the second switch element is cut off when the first switch element is conducted, and the second switch element is conducted when the first switch element is cut off such that that the output switching circuit outputs the ground voltage; wherein, the first switch element is a first-type switch element, the second switch element is a second-type switch element, and a type of the first switch element is opposite to a type of the second switch element;

wherein, when the high level shifting unit is in a cut-off state, the high level shifting unit further receives the first bias voltage such that the high level shifting unit is in a partially cut-off state; when the low level shifting unit is in the cut-off state, the low level shifting unit further receives the second bias voltage such that the low level shifting unit is in the partially cut-off state.

2. The level shifter according to claim 1, wherein the first bias voltage providing unit comprises:
a third switch element, comprising a control terminal, a first path terminal and a second path terminal; wherein, the first path terminal is connected to the first operating voltage, the control terminal and the second path terminal are connected at a connecting position defined as a first node;
a first bias current providing circuit, connected to the first node, further connected to the third switch element via the first node to provide the third switch element with a bias current to enable the third switch to generate the first bias voltage at the first node; and
a first voltage buffer circuit, connected to the first node to buffer the first bias voltage outputted.

3. The level shifter according to claim 1, wherein the high level shifting unit comprises:
a fourth switch element, comprising a control terminal, a first path terminal and a second path terminal, wherein the first path terminal is connected to the first operating voltage, and the second path terminal serves as an output end of the high level shifting unit and is connected to the low level shifting unit; and
a first source follower circuit, connected to the control terminal of the fourth switch element at a connecting position defined as a second node, further connected to the first bias voltage providing unit via the second node to cause a voltage at the second node to change with a change in the first bias voltage, such that the fourth switch element is in the partially cut-off state when the high level switch element is in the cut-off state.

4. The level shifter according to claim 1, wherein the second bias voltage providing unit comprises:
a fifth switch element, comprising a control terminal, a first path terminal and a second path terminal, wherein the first path terminal is connected to the second operating voltage, and the control terminal and the second path terminal are connected at a connecting position defined as a third node;
a second bias current providing circuit, connected to the third node, further connected to the fifth switch element via the third node to provide the fifth switch element with a bias current to enable the fifth switch element to generate the second bias voltage at the third node; and
a second voltage buffer circuit, connected to the third node to buffer the second bias voltage outputted.

5. The level shifter according to claim 1, wherein the low level shifting unit comprises:
a sixth switch element, comprising a control terminal, a first path terminal and a second path terminal, wherein the first path terminal is connected to the second operating voltage, and the second path terminal serves as an output end of the low level shifting unit and is connected to the high level shifting unit; and
a second source follower circuit, connected to the control terminal of the sixth switch element at a connecting position defined as a fourth node, further connected the second bias voltage providing unit via the fourth node to cause a voltage at the fourth node to change with a change in the second bias voltage, such that the sixth switch element is in the partially cut-off state when the low level shifting unit is in the cut-off state.

6. The level shifter according to claim 2, wherein the first bias current providing circuit comprises:
a seventh switch element, comprising a control terminal, a first path terminal and a second path terminal, wherein the first path terminal is connected to the ground voltage, and the control terminal and the second path terminal are both connected to a first voltage source; and
an eighth switch element, comprising a control terminal, a first path terminal and a second path terminal, wherein the control terminal is connected to the first voltage source, the first path terminal is connected to the ground terminal, and the second path terminal is connected to the first node to provide the bias current to the third switch element.

7. The level shifter according to claim 2, wherein the first voltage buffer circuit comprises:
a first operational amplifier, comprising an input end, a negative input end and an output end, wherein the negative input end is connected to the first node;
a ninth switch element, comprising a control terminal, a first path terminal and a second path terminal, wherein the control terminal is connected to the second operating voltage, and the second path terminal is connected to the ground voltage; and
a tenth switch element, comprising a control terminal, a first path terminal and a second path terminal, wherein the control terminal is connected to the output end of the first operational amplifier, the first path terminal is connected to the first operating voltage, and the second path terminal is connected to the first path of the ninth switch at a connecting position defined as a fifth node, which is further connected to the positive input end of the first operational amplifier.

8. The level shifter according to claim 3, wherein the first source follower circuit comprises:

an eleventh switch, comprising a control terminal, a first path terminal and a second path terminal, wherein the control terminal is connected to the first bias voltage providing unit, and the first path terminal is connected to the first operating voltage;

a twelfth switch element, comprising a control terminal, a first path terminal and a second path terminal, wherein the control terminal receives the first control signal, the second path terminal is connected to the ground voltage and the first path terminal is connected to the second path terminal of the eleventh switch element, and a connecting position between the second path terminal of the eleventh switch element and the first path terminal of the twelfth switch element is the second node, which is further connected to the control terminal of the fourth switch element.

9. The level shifter according to claim 8, wherein the high level shifting unit further comprises:

a first capacitor, disposed between the control terminal of the twelfth switch element and the second node.

10. The level shifter according to claim 4, wherein the second bias current circuit comprises:

a thirteenth switch element, comprising a control terminal, a first path terminal and a second path terminal, wherein the first path terminal is connected to the first operating voltage, and the control terminal and the second path terminal are both connected to a second voltage source; and a fourteenth switch element, comprising a control terminal, a first path terminal and a second path terminal, wherein the control terminal is connected to the second voltage source, the first path terminal is connected to the first operating voltage, and the second path terminal is connected to the third node to provide the bias current to the fifth switch element.

11. The level shifter according to claim 4, wherein the second voltage buffer circuit comprises:

a second operational amplifier, comprising a positive input end, a negative input end and an output end, wherein the negative input end is connected to the third node;

a fifteenth switch element, comprising a control terminal, a first path terminal and a second path terminal, wherein the control terminal is connected to the output end of the second operational amplifier, and the first path terminal is connected to the first operating voltage; and a sixteenth switch element, comprising a control terminal, a first path terminal and a second path terminal, wherein the control terminal and the second path terminal are both connected to the ground voltage, and the first path terminal is connected to the second path terminal of the fifteenth switch element at a connecting position defined as a sixth node, which is further connected to the positive input end of the second operational amplifier.

12. The level shifter according to claim 5, wherein the second source follower circuit comprises:

a seventeenth switch element, comprising a control terminal, a first path terminal and a second path terminal, wherein the control terminal is connected to the second bias voltage providing unit, and the firth path terminal is connected to the first operating voltage; and an eighteenth switch element, comprising a control terminal, a first path terminal and a second path terminal, wherein the second path terminal is connected to the ground voltage, and the first path terminal is connected to the second path terminal of the seventeenth switch, and a connecting position between the second path terminal of the seventeenth switch element and the first path terminal of the eighteenth switch element is the fourth node, which is further connected to the control terminal of the sixth switch element.

13. The level shifter according to claim 12, wherein the low level shifting unit further comprises:

a second capacitor, disposed between the control terminal of the eighteenth switch element and the fourth node.

14. The level shifter according to claim 1, wherein the output switching circuit further comprises:

a first buffer unit, disposed between the output end of the level shifting circuit and the first path terminal of the first switch element; and a second buffer unit, disposed between the second control signal and the first path terminal of the second switch element.

15. The level shifter according to claim 14, wherein the first buffer unit comprises:

a first inverter, disposed between the first operating voltage and the second operating voltage, comprising an input end and an output end, wherein the input end of the first inverter is connected to the output end of the level shifting circuit; and a second inverter, disposed between the first operating voltage and the second operating voltage, comprising an input end and an output end, wherein the input end of the second inverter is connected to the first path terminal of the first switch element.

16. The level shifter according to claim 14, wherein the second buffer unit comprises:

a third inverter, disposed between the second operating voltage and the ground voltage, comprising an input end and an output end, wherein the input end of the third inverter is receives the second control signal;

a fourth inverter, disposed between the second operating voltage and the ground voltage, comprising an input end and an output end, wherein the input end of the fourth inverter is connected to the output end of the third inverter; and a fifth inverter, disposed between the second operating voltage and the ground voltage, comprising an input end and an output end, wherein the input end of the fifth inverter is connected to the output end of the fourth inverter, and the output end of the fifth inverter is connected to the first path terminal of the second switch element to transmit an inverted signal of the second control signal to the first path terminal of the second switch element.

17. The level shifter according to claim 1, wherein the first control voltage is greater than a difference between the second operating voltage and a threshold voltage of the first switch element, and the second control voltage is smaller than a sum of the second operating voltage and a threshold voltage of the second switch element.

\* \* \* \* \*